United States Patent
Kohara et al.

(10) Patent No.: US 7,967,957 B2
(45) Date of Patent: Jun. 28, 2011

(54) METHOD FOR PREPARING ALUMNA COATING FILM HAVING ALPHA-TYPE CRYSTAL STRUCTURE AS PRIMARY STRUCTURE

(75) Inventors: Toshimitsu Kohara, Hyogo (JP); Hiroshi Tamagaki, Hyogo (JP); Yoshimitsu Ikari, Hyogo (JP)

(73) Assignee: Kobe Steel, Ltd., Kobe-shi (JP)

( * ) Notice: Subject to any disclaimer, the term of this patent is extended or adjusted under 35 U.S.C. 154(b) by 2021 days.

(21) Appl. No.: 10/523,815

(22) PCT Filed: Aug. 8, 2003

(86) PCT No.: PCT/JP03/10115
§ 371 (c)(1),
(2), (4) Date: Feb. 4, 2005

(87) PCT Pub. No.: WO2004/015162
PCT Pub. Date: Feb. 19, 2004

(65) Prior Publication Data
US 2006/0006059 A1    Jan. 12, 2006

(30) Foreign Application Priority Data

Aug. 9, 2002 (JP) .................................. 2002-233847
Aug. 9, 2002 (JP) .................................. 2002-233848

(51) Int. Cl.
*C23C 14/08* (2006.01)
(52) U.S. Cl. ......... 204/192.16; 204/192.12; 204/192.13; 204/192.15
(58) Field of Classification Search ............. 204/192.12, 204/192.13, 192.15, 192.16
See application file for complete search history.

(56) References Cited

U.S. PATENT DOCUMENTS

| 3,911,579 | A | * | 10/1975 | Lane et al. .................. | 30/346.54 |
| 5,292,417 | A | | 3/1994 | Kugler | |
| 5,693,417 | A | | 12/1997 | Goedicke et al. | |
| 5,698,314 | A | | 12/1997 | Goedicke et al. | |
| 5,789,071 | A | * | 8/1998 | Sproul et al. .................. | 428/216 |
| 6,217,720 | B1 | | 4/2001 | Sullivan et al. | |
| 6,290,825 | B1 | * | 9/2001 | Fu ............................. | 204/298.2 |

FOREIGN PATENT DOCUMENTS

EP    0 719 874 A1    7/1996
(Continued)

OTHER PUBLICATIONS

Zywitzki, O. et al. "Effect of the substrate temperature on the structure and properties of Al2O3 layers reactively deposited by pulsed magnetron sputtering." Surface and Coating Technology 82 pp. 169-175. 1996.*

(Continued)

*Primary Examiner* — Nam X Nguyen
*Assistant Examiner* — Jason M Berman
(74) *Attorney, Agent, or Firm* — Oblon, Spivak, McClelland, Maier & Neustadt, L.L.P.

(57) ABSTRACT

For forming alumina films on substrates by sputtering of an aluminum metal target in an oxidizing gas-containing atmosphere, a method of producing α crystal structure-based alumina films efficiently includes as an early film formation, forming films under conditions suited for formation of α crystal structure alumina. For example the forming forms films of αcrystal structure alumina in a poisoning mode discharge condition only in an early stage of film formation.

9 Claims, 7 Drawing Sheets

| FOREIGN PATENT DOCUMENTS | | |
|---|---|---|
| JP | 63-62875 | 3/1988 |
| JP | 2-115359 | 4/1990 |
| JP | 4-136165 | 5/1992 |
| JP | 4-325680 | 11/1992 |
| JP | 8-176821 | 7/1996 |
| JP | 2742049 | 1/1998 |
| JP | 2001-234338 | 8/2001 |
| JP | 2001-335917 | 12/2001 |
| JP | 2001-342556 | 12/2001 |
| JP | 2002-53946 | 2/2002 |
| JP | 2002-212719 | 7/2002 |
| WO | 00/68452 | 11/2000 |

OTHER PUBLICATIONS

U.S. Appl. No. 11/174,551, filed Jul. 6, 2005, Kohara, et al.
U.S. Appl. No. 10/554,601, filed Oct. 27, 2005, Tamagaki, et al.
U.S. Appl. No. 10/551,993, filed Oct. 4, 2005, Tamagaki, et al.
European Search Report issued Sep. 6, 2010 in PCT/JP0310115.
Zywitzki O et al: "Influence of coating parameters on the structure and properties of Al2O3 layers reactively deposited by means of pulsed magnetron sputtering" Surface and Coatings Technology Elsevier Switzerland, vol. 86-87, No. 1-3, Dec. 15, 1996, pp. 640-647, XP002597919, ISSN: 0257-8972, figure 1: table 1, p. 642, right-hand column, paragraph 2.

* cited by examiner

METHOD FOR PREPARING ALUMNA COATING FILM HAVING ALPHA-TYPE CRYSTAL STRUCTURE AS PRIMARY STRUCTURE

FIELD OF THE INVENTION

This invention relates to a method of producing α crystal structure-based alumina films and, more particularly, to a useful method by which α crystal structure-based alumina films for coating/covering wear-resistant members, such as cutting tools, sliding members and molds, can be formed efficiently. The present invention also relates to a method of producing useful α crystal structure-based alumina films by which method the above-mentioned alumina films can be formed efficiently in a relatively low temperature range.

In the following, the case of application to cutting tools is taken as a typical example and explained with the focus narrowed thereon, although the alumina coat films obtained in accordance with the present invention can be applied in such various fields as mentioned above.

BACKGROUND ART

Generally, cutting tools and sliding members, which are required to have good wear resistance and sliding characteristics, are used in the form having a hard coat film of titanium nitride, titanium aluminum nitride or the like as formed on the surface of a substrate such as a high speed steel or cemented carbide by the physical vapor deposition method (hereinafter referred to as "PVD method") or chemical vapor deposition method (hereinafter referred to as "CVD method"), among others. For use as cutting tools, in particular, the hard coat film mentioned above is required to have wear resistance and heat resistance (antioxidant properties at elevated temperatures), and the above-mentioned titanium aluminum nitride (TiAiN), for instance, which can retain both the characteristics mentioned above stably up to such a high temperature as about 800° C., has recently been in wide use as a coating/covering material for cemented carbide tools and the like the tip temperature of which becomes high on the occasion of cutting.

Meanwhile, the tip of a cutting tool or the like may reach such a high temperature as 1,000° C. or above in the step of cutting. In such circumstances, it is impossible to secure a sufficient level of heat resistance with the above-mentioned hard coat film alone and, therefore, an alumina layer, for example, is further formed after the formation of the above-mentioned hard coat film to secure heat resistance, as disclosed in Japanese Patent No. 2742049.

The crystal structure of alumina varies depending on the formation temperature. When the substrate temperature is not higher than about 500° C., an amorphous structure predominates and, when it is within the range of about 500-1,000° C., the γ crystal structure predominates. Either crystal structure is in a thermally metastable state. However, when the tip temperature varies markedly in a wide range of from ordinary temperature to 1,000° C. or above in the step of cutting, as found with cutting tools, the crystal structure of alumina changes markedly, which causes problems, for example film cracking or/and peeling.

On the contrary, the α crystal structure (corundum structure), which is formed at a substrate temperature elevated to 1,000° C. or above by employing the CVD method, once formed, preserves its thermally stable structure thereafter, irrespective of temperature. Therefore, coating with α crystal structure alumina is regarded as a very effective means for providing cutting tools or the like with heat resistance.

Since, however, α crystal structure alumina cannot be formed without heating the substrate to 1,000° C. or above, as mentioned above, there is a restriction as to applicable substrates. When exposed to elevated temperatures exceeding 1,000° C., some substrates will be softened and lose their aptitude for use as substrates for wear-resistant members. Even such substrates for high temperature use as cemented carbides, when exposed to such high temperatures, cause problems such as deformation. Furthermore, the temperature range for the practical use of hard coat films, such as TiAiN films, formed as wear resistance-providing films on substrates is generally about 800° C. at the highest, so that when heated to high temperatures exceeding 1,000° C., the films may undergo denaturation, possibly leading to a deterioration in wear resistance.

To cope with such problems, a method has been proposed by which α crystal structure alumina films can be formed while still lowering the substrate temperature. For example, it is reported by O. Zywitzki, G. Hoetzsch et al. that when reactive sputtering (pulsed magnetron sputtering) is carried out using a pulsed high output power source (11-17 kW), aluminum oxide films with the corundum structure (α crystal structure) are formed even at 750° C. (cf Surf. Coat. Technol. 86-87, 1996, pp. 640-647).

Further, in JP-A-2002-53946, it is disclosed that the method comprising forming an α crystal structure alumina coat film on an undercoat layer of a corundum structure (α crystal structure) oxide with a lattice parameter of not less than 4.779 Å but not exceeding 5.000 Å and a film thickness of at least 0.005 µm is effective.

Meanwhile, the PVD method can readily form various compound layers under milder conditions as compared with the CVD method and, among others, the sputtering technique which comprises using a metal target as the sputtering evaporation source and forming a metal compound on a substrate in a reactive gas atmosphere is in wide use since it can form various kinds of compound layers more easily. In forming alumina coat films, sputtering is carried out in an atmosphere of oxygen, which is a reactive gas, using an aluminum metal target to form alumina films on substrates.

As regards the discharge condition during sputtering in such a film-forming step, the relation between the rate of flow of oxygen gas introduced and the discharge voltage is represented by such a hysteresis curve as schematically shown in FIG. 1 when the discharge power is constant. More specifically, when the oxygen flow rate is gradually increased from a low level, the discharge voltage rapidly decreases at a certain oxygen flow rate and, conversely, when the oxygen flow rate is gradually decreased from a high level, the discharge voltage rapidly increases at a certain oxygen flow rate, as shown in FIG. 1.

Thus, such discharge conditions mentioned above are generally classifiable into three modes, as schematically illustrated in FIG. 1, namely the metal mode in which the discharge voltage is relatively high and the oxygen gas introduced is mostly consumed in alumina formation as a result of reaction with aluminum atoms formed by sputtering, the poisoning mode in which the discharge voltage is relatively low and the oxygen gas introduced still remains in excess after reaction with aluminum atoms formed by sputtering, hence the aluminum target surface, too, is oxidized, and the transition mode in which the discharge voltage shows an intermediate value between the above two discharge conditions.

When alumina films are formed in the respective discharge conditions, the rate of film formation is rapid but films containing metallic Al with a higher Al content as compared with the atomic ratio (Al:O=2:3) in alumina are formed in the metal mode discharge condition. In the poisoning mode discharge condition, the films formed contain no metallic Al and are substantially composed of alumina alone but the film formation rate becomes extremely slow since the aluminum metal target itself is also oxidized, as mentioned above, hence the quantity of Al evaporated is small.

Therefore, attempts have been made to form alumina-based films low in metallic Al content efficiently at a high film formation rate in the transition mode discharge condition by combining the respective advantages of the metal mode and poisoning mode.

In the transition mode, however, a slight change in the oxygen flow rate, which is one of the factors to be controlled, results in an abrupt substantial change to the metal mode side or poisoning mode side, as shown in FIG. 1, so that a stable discharge condition cannot be maintained. Therefore, such methods as described below have been so far proposed to secure the transition mode stably.

One method comprises maintaining the oxygen flow rate at a substantially constant level and controlling the discharge voltage. FIG. 2 shows the relation between the discharge voltage and discharge current as found in sputtering of an aluminum metal target while varying the voltage in an Ar gas and an oxygen gas (the rates of flow of both being constant). In this case, too, there are the above-mentioned three patterns of discharge condition (metal mode, transition mode, and poisoning mode), as schematically illustrated in FIG. 2. Unlike the case of FIG. 1, however, it can be seen that the transition mode condition can be maintained almost stably by adequately controlling the discharge voltage.

As for another method of stably maintaining the transition mode, JP-A-H04-325680 discloses that, when the dual magnetron sputtering (DMS) technique is employed for film formation, the discharge condition can be adjusted to the transition mode by controlling the oxygen gas flow rate so that the measured voltage of the sputtering cathode may be equal to the desired voltage. Further, in JP-A-H04-136165, it is disclosed that the discharge condition can be stabilized and qualitatively stable films can be obtained by controlling the partial pressure of a reactive gas in the film-forming chamber, for example the partial pressure of oxygen.

However, even when such a discharge condition suited for alumina film formation can be secured, it is difficult to form α crystal structure-based alumina; it is impossible to avoid contamination with γ crystal structure alumina. In particular, when the film formation rate is increased to thereby secure a desired level of productivity, or when film formation is carried out in a relatively low temperature range so that the characteristics of the substrate, for instance, may not be deteriorated, there is observed a tendency toward ready formation of γ crystal structure alumina; further investigations are required for obtaining α crystal structure-based alumina films.

Meanwhile, within the range of conditions favorable for the formation of α crystal structure alumina, it is difficult to obtain films with high hardness. On the other hand, when, for example, a bias voltage is applied to obtain alumina films higher in hardness, a mixed phase composed of α crystal structure alumina and γ crystal structure alumina will result, hence α crystal structure-based alumina films cannot be obtained. Therefore, for obtaining α crystal structure alumina films higher in film hardness, further investigations are required.

The present invention has been made in view of such circumstances as discussed above, and it is an object of the invention to provide a method of producing useful α crystal structure-based alumina films by which α crystal structure-based alumina films having good heat resistance can be efficiently formed on substrates or hard coat films such as the above-mentioned TiAlN in a relatively low temperature range in which the substrates and apparatus, among others, will not be put under thermal load and by which α crystal structure-based alumina films higher in hardness can be formed on such substrates or hard coat films.

DISCLOSURE OF INVENTION

The method of producing α crystal structure alumina films according to the invention is characterized in that it comprises, as an initial film forming step, the step of forming alumina films under conditions suited for the formation of α crystal structure alumina in forming alumina films on substrates by sputtering of an aluminum metal target in an oxidizing gas-containing atmosphere (hereinafter sometimes referred to as "first mode of practice").

Thus, when the film formation conditions are switched to high-speed film formation conditions after film formation under the conditions suited for the formation of α crystal structure alumina, α crystal structure alumina films can favorably be formed with high efficiency.

Further, when film formation is carried out under low temperature conditions after film formation under conditions suited for the formation of α crystal structure alumina, the deterioration of the characteristics of the substrates and of the hard coat films already formed, among others, can be prevented and, further, the thermal load on the apparatus can favorably be reduced as well.

As preferred embodiments of the above-mentioned method of film formation after film formation under conditions suited for the formation of α crystal structure alumina, there may be mentioned the method comprising changing the discharge condition to the transition mode or metal mode and forming films after film formation in the poisoning mode discharge condition in the early stage of film formation, and the method comprising forming films at a film formation rate of not lower than 3 nm/min after film formation at a film formation rate of not higher than 1 nm/min in the early stage of film formation.

As a preferred embodiment of the above-mentioned method of forming films under low temperature conditions after film formation under conditions suited for the formation of α crystal structure alumina, there may be mentioned the method comprising lowering the substrate temperature to 650-750° C. and forming films after film formation at a substrate temperature not lower than 800° C. in the early stage of film formation.

When, after film formation under conditions suited for the formation of α crystal structure alumina, films are formed by changing the conditions to those under which films with high hardness can be formed, as mentioned above, α crystal structure-based alumina films higher in hardness can favorably be obtained.

As the method of obtaining such highly hard α crystal structure-based alumina films, there may be mentioned the method comprising forming films while applying no negative bias voltage to substrates or applying a relatively low bias voltage to substrates in the early stage of film formation and then forming films while applying a negative bias voltage or increasing the absolute value of that bias voltage, for example the method comprising forming films while applying a negative bias voltage not higher in absolute value than 100 V in the early stage of film formation and then forming films at a negative voltage increased to 200 V or above in absolute value.

The present invention also provides a method of producing α crystal structure alumina films which is characterized in that, in forming alumina films on substrates by sputtering of an aluminum metal target in an oxidizing gas-containing atmosphere, alumina films are formed on substrates intermittently in a plurality of substeps, with the thickness of the films formed in each substep being not greater than 5 nm (hereinafter sometimes referred to as "second mode of practice").

When the thickness of the films formed in each substep is set at 2 nm or smaller in the early stage and then increased in the middle and later stages, the load on the apparatus, for example the rotating mechanisms, can desirably be reduced.

As more specific techniques for practicing the present invention, there may be mentioned the following:

(a) The method comprising providing a turntable so as to face the direction of sputtering of an aluminum metal target(s), fixing a substrate(s) to the turntable, and forming alumina films intermittently on the substrate(s) while rotating the turntable;
(b) The method comprising providing a turntable so as to face the direction of sputtering of an aluminum metal target(s), disposing satellite rotary members on the turntable, fixing substrates to the satellite rotary members, and forming alumina films intermittently on the substrates while rotating the turntable and satellite rotary members;
(c) The method comprising providing a turntable so as to face the direction of sputtering of an aluminum metal target(s), disposing satellite rotary members on the turntable, providing each satellite rotary member with a rotary member(s), fixing substrates to the rotary members, and forming alumina films intermittently on the substrates while rotating the turntable, satellite rotary members and rotary members;
(d) The method comprising causing a substrate disposed so as to face the direction of sputtering of an aluminum metal target to move reciprocally in the direction crossing the direction of sputtering for intermittent alumina film formation on the substrate;
(e) The method comprising disposing a substrate so as to face the direction of sputtering of an aluminum metal target, disposing a shutter between the aluminum metal target and substrate, and opening and closing the shutter for intermittent alumina film formation on the substrate; and
(f) The method comprising intermittently sputtering an aluminum metal target against a substrate disposed so as to face the direction of sputtering of the aluminum metal target for intermittent alumina film formation on the substrate.

As for the technique for controlling the film thickness per substep in the above-mentioned methods (a) to (c), the intermittent film formation cycles can properly controlled by adjusting the revolution speed of the turntable, satellite rotary members or rotary members. The turntable is preferably rotated at 3 rpm or a greater revolution speed. In a preferred embodiment, the satellite rotary members are rotated at 20 rpm or a greater revolution speed.

It is considered that the intermittent film formation cycles can be controlled by appropriately adjusting the reciprocating cycle in the above-mentioned method (d), the shutter opening/closing cycle in the method (e), and the intermittent sputtering cycle in the method (f).

Figure 1:
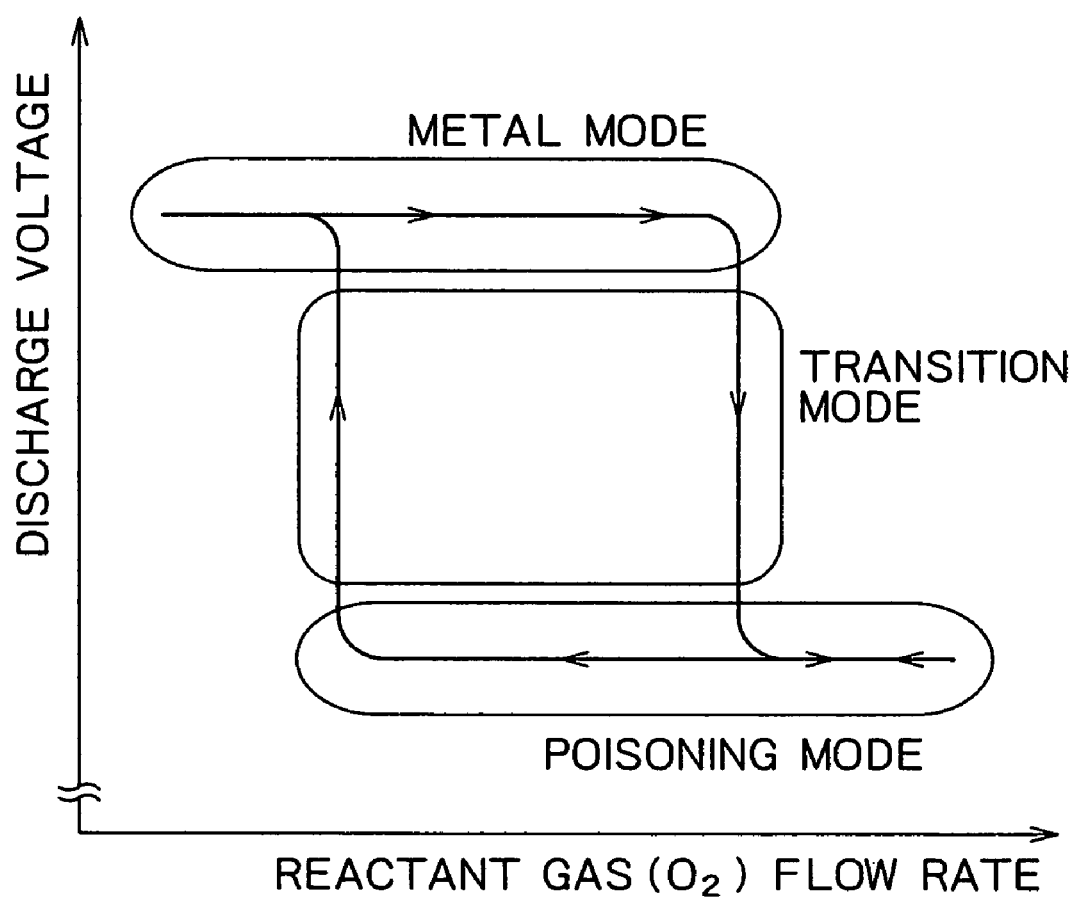
FIG. 1 is a schematic representation of the relation between the rate of flow of oxygen introduced and the discharge voltage as found upon sputtering of an aluminum metal target in an oxidizing gas-containing atmosphere.
Figure 2:
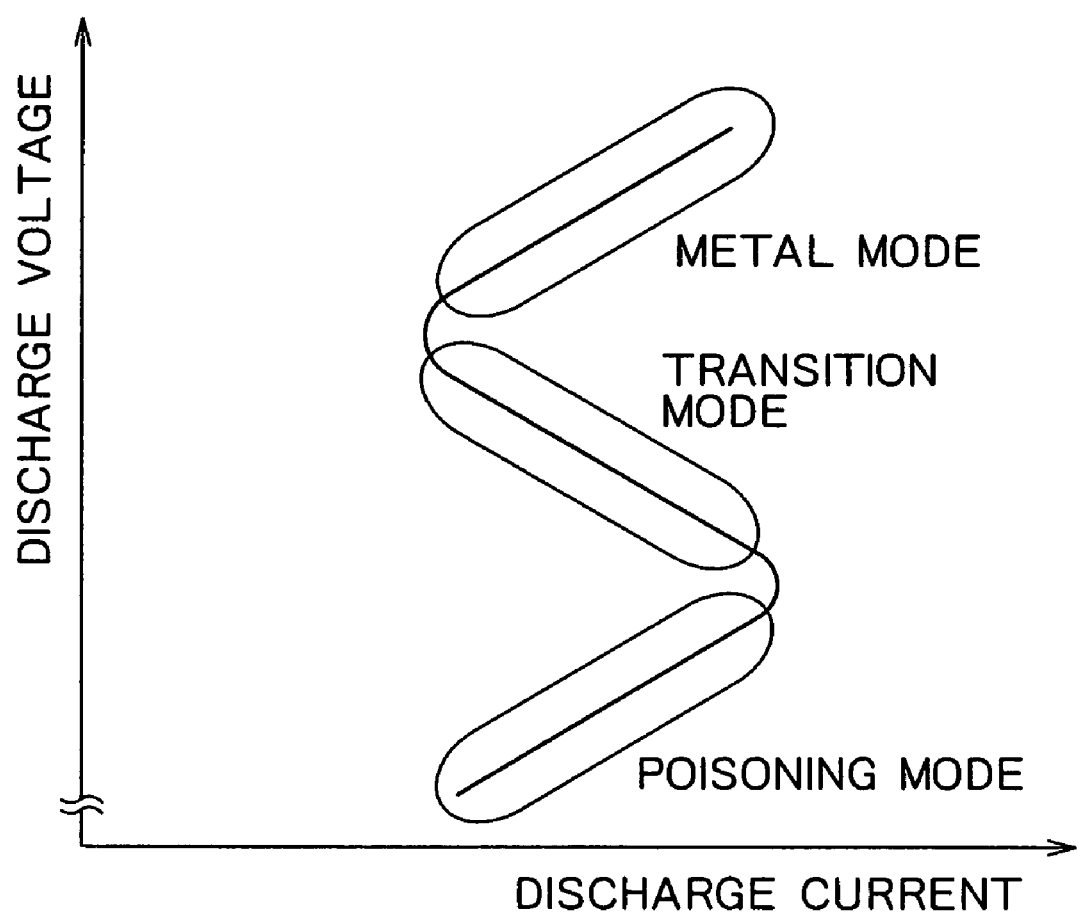
FIG. 2 is a schematic representation of the relation between the discharge voltage and discharge current as found upon sputtering of an aluminum metal target in an oxidizing gas-containing atmosphere.

BEST MODES FOR CARRYING OUT THE INVENTION (1) Re: First Mode of Practice

Under such circumstances as discussed hereinabove, the present inventors made investigations in search of a method of efficiently forming α crystal structure-based alumina films (hereinafter sometimes referred to as "α type-based alumina films" for short) under reduced thermal load conditions relative to the substrates, hard coat films, apparatus and so forth by employing the method comprising sputtering an aluminum metal target(s) in an oxidizing gas-containing atmosphere. As a result, they found that satisfactory results can be obtained when the film formation conditions in the early stage of film formation are controlled. This finding has led to completion the present invention described above.

Thus, it was found that when the film formation in the early stage is carried out under conditions suited for the formation of α crystal structure alumina to thereby form α crystal structure alumina as an undercoat, α type-based alumina films can be formed without fail even upon changing the film formation conditions in the middle and later stages of film formation to (i) those conditions suited for increasing productivity, (ii) those low temperature conditions suited for maintaining the characteristics of the substrates and so on, or (iii) those manufacturing conditions suited for the formation of alumina films higher in hardness and, as a result, α type-based alumina films can be efficiently formed at a high rate, or such films can be formed while suppressing the thermal load on the substrates, hard coat films already formed, apparatus and so forth, or α type-based alumina films higher in hardness can be obtained.

The above-mentioned "α crystal structure alumina" formed in the early stage of film formation desirably has a thickness of at least about 1 nm.

While the mechanisms by which α type-based alumina films are efficiently formed in the manner mentioned above are not clear, α type-based alumina films are efficiently formed presumably because the a structure alumina crystal nuclei formed as an undercoat on the substrate in the early stage of film formation allow the subsequent growth of α crystal structure alumina with the a structure crystal nuclei already formed serving as bases therefor even if the production conditions are more or less changed thereafter.

For utilizing such film formation mechanisms, the present inventors specifically studied the conditions suited for the formation of α crystal structure alumina in the early stage of film formation and the film formation conditions in the middle and later stages of film formation and, as a result, found out that the methods shown below under (I) to (III) are effective. Thus:

(I) When the rate of film formation is increased in the middle and later stages:

(I-1) In the early stage of film formation, α crystal structure alumina is formed in the poisoning mode discharge condition and then the discharge condition is changed to the transition mode or metal mode for carrying out film formation at a higher rate.

(I-2) In the early stage of film formation, α crystal structure alumina is formed without fail by carrying out the film formation at a film formation rate of not higher than 1 nm/min, which is followed by film formation at a film formation rate of 3 nm/min or higher so that higher rate film formation may be accomplished.

(II) When the substrate temperature is lowered in the middle and later stages of film formation:

In the early stage of film formation, α crystal structure alumina is formed at a substrate temperature not lower than 800° C. and, then, the substrate temperature is lowered to 650-750° C. for the subsequent film formation.

(III) When α type-based alumina films higher in hardness are to be formed:

In the early stage of film formation, α crystal structure alumina is formed while no negative bias voltage is applied or, when applied, the negative bias voltage is controlled so that any crystal phases other than the α crystal structure phase may not be formed and, then, a negative bias voltage is applied or a negative bias voltage higher in absolute value is applied for the subsequent film formation.

In the following, the reasons why the methods mentioned above under (I) to (II) are preferred are described in detail.

First, regarding the above-mentioned method (I-1), the present inventors attempted alumina film formation on $Cr_2O_3$ films in the poisoning mode discharge condition based on the known technology mentioned hereinabove. As a result, as mentioned above, it was found that when film formation is carried out at a substrate temperature of about 760° C., α type-based alumina is indeed formed but the film formation rate is extremely slow, hence impractical. When, on the other hand, film formation is carried out in the transition mode or metal mode discharge condition for increasing the film formation rate, the alumina films formed substantially show the α type crystal structure alone or an α type/α type mixed crystal structure rich in γ type; those films which the present invention is to provide cannot be obtained.

Therefore, the present inventors investigated the relation between the discharge condition during film formation and the crystal structure of the alumina films formed, and found that when α crystal structure alumina is formed as an undercoat by carrying out the early stage of film formation alone in the poisoning mode, α type-based alumina films can be formed without fail even if the discharge condition is changed to the transition mode or metal mode in the middle and later stages of film formation for higher rate film formation. This is presumably due to the fact that since a structure alumina crystal nuclei are formed as an undercoat in the early stage of film formation, α crystal structure alumina grows successively utilizing the a structure crystal nuclei already formed as bases even if the discharge condition is subsequently changed to the transition mode or metal mode in which α crystal structure alumina is hardly formed.

As mentioned hereinabove, a long time is required for the formation of films in the poisoning mode. According to the invention, however, the early film formation stage alone is carried out in the poisoning mode and, in the middle and later stage of film formation, the discharge condition is changed to the transition mode or metal mode in which the film formation rate is higher, with the result that the total film formation time is markedly shortened.

Further, when film formation is carried out in the transition mode discharge condition from the early stage of film formation, it is difficult to form α crystal structure alumina unless the substrate temperature is raised to about 800° C. or above. It was found that when alumina films are formed by the method (I-1) mentioned above, α crystal structure alumina can be formed without fail and the thermal load on the substrates, apparatus and so forth can be reduced by controlling the substrate temperature in the middle and later stages of film formation so that it may not become lower than 700° C.

Since film formation in the metal mode readily allows contamination of alumina films with metallic aluminum, as mentioned hereinabove, film formation in the middle and later stages of film formation is preferably carried out in the transition mode discharge condition.

Now, the method (I-2) mentioned above is explained. Even when the discharge condition is in the transition mode or metal mode, it is possible to form α crystal structure alumina by reducing the discharge power and thereby lowering the film formation rate and thus carrying out film formation under milder conditions. However, when alumina films are formed at such a film formation rate throughout the whole film formation step, the production efficiency is very poor, hence such process is impractical. Therefore, α crystal structure alumina was formed without fail by film formation at a film formation rate of not higher than 1 nm/min in the early stage of film formation alone and then film formation was carried out at an increased film formation rate of 3 nm/min or above, whereupon pure α crystal structure alumina films could be obtained almost in the same manner as the case in which film formation is carried out at a low rate not exceeding 1 nm/min throughout the film formation.

This is presumably due to the fact that since a structure alumina crystal nuclei are formed as an undercoat in the early stage of film formation, α crystal structure alumina can grow subsequently utilizing, as bases, the α structure crystal nuclei already formed when film formation is continued after changing the film formation conditions to those for higher rate film formation under which α crystal structure alumina is formed with difficulty.

When the film formation rate in the early stage of film formation is not higher than 0.5 nm/min, α crystal structure alumina, which is to serve as an undercoat, can be formed without fail. Further, a film formation rate of not lower than 10 nm/min in the middle and later stages of film formation is desirable, since the film formation can then be accomplished with better efficiency. The discharge condition in carrying out the method (I-2) is not particularly restricted but, for efficient film formation, the transition mode or metal mode is preferably employed and, as mentioned above, film formation in the transition mode is desirable for forming alumina films with a metal aluminum content as low as possible.

The method (II) mentioned above is now explained. When the substrate temperature is raised in the early stage of film formation, α crystal structure alumina is readily formed even in the transition mode or metal mode discharge condition. Therefore, the present inventors formed α crystal structure alumina as an undercoat by raising the substrate temperature in the early film formation stage alone and then lowered the substrate temperature and continued film formation. It was found that, on such occasion, α type-based alumina films are formed without fail. In this case, too, it is presumable that since α structure alumina crystal nuclei are formed as an undercoat in the early stage of film formation, α crystal structure alumina can subsequently grow utilizing, as bases, the α structure crystal nuclei already formed even when the film formation conditions are changed to those unfavorable for the formation of α crystal structure alumina by lowering the substrate temperature.

Specifically, the early stage of film formation is preferably carried out at a substrate temperature not lower than 800° C., more preferably 850° C. or higher, since α type-based alumina can then be formed without fail. In view of the object of the invention, the upper limit to the substrate temperature should be lower than 1,000° C.

Thus, when α crystal structure alumina is formed in the early stage of film formation, α crystal structure alumina films can be obtained without fail even if the substrate temperature is lowered to about 650-750° C. in the middle and later stages of film formation; the thermal load on the substrates and hard coat films already formed and, further, apparatus and so forth can be reduced, and the heating mechanisms can also be more simplified. When the film formation temperature in the middle and later stages of film formation is excessively low, the proportion of γ crystal structure alumina increases, hence the substrate temperature is preferably not lower than 700° C.

The discharge condition to be selected in employing the method (II) is not particularly restricted, either, but the transition mode or metal mode is preferably employed for efficient film formation; for the same reasons as mentioned above, film formation in the transition mode is advantageous for the formation of alumina films with a metallic Al content as low as possible.

Then, the method (III) mentioned above is explained. In carrying out film formation by the above-described methods (I) and (II), the film formation is carried out without applying any bias voltage to the substrates. The films obtained by the above-mentioned method (I-1) was evaluated for hardness by the nanoindentation method to be described later herein and found to be about 22-23 GPa.

The present inventors investigated various film formation conditions to obtain α type-based alumina higher in hardness and found that the application of a negative bias voltage during film formation, in particular, is effective. Thus, as the means for obtaining films with high hardness, there may specifically be mentioned striving for densification of the alumina films formed, or giving a compression stress to the films formed. In striving for densification of alumina films, for instance, in this manner, it is the application of a negative bias voltage during film formation that is effective. This is presumably due to following effects. When a negative bias voltage is applied, the films during film formation grow under bombardment with ions corresponding in energy to the bias voltage, with the results that the growing films become densified and/or the compression stress which the films have is increased.

First, the present inventors formed alumina films while applying a negative bias voltage of 300 V in absolute value throughout the whole film formation step and examined the films for hardness. Since alumina films are insulating films, the bias voltage was applied intermittently at a high frequency of 10 kHz or higher (in the following, including the examples, bias voltage application was carried out intermittently in this manner). The films obtained in the above manner had a high hardness of about 27 GPa. It was confirmed, however, by X ray diffraction analysis that the alumina films contained the γ type crystal structure in small proportions.

Therefore, the present inventors first formed α type-based alumina films by the above-mentioned method (I-1) without applying any bias voltage and then carried out film formation under the same constant conditions except that a negative bias voltage of 300 V in absolute value was applied to the substrates. As a result, the α crystal structure alone was observed upon X ray diffraction analysis and the formation of α crystal structure alumina films was confirmed. The hardness value was as high as about 26 GPa.

When the above method (III) is carried out, a structure alumina crystal nuclei are also formed as an undercoat in the early stage of film formation. Therefore, highly hard α crystal structure alumina can grow successively with the a structure crystal nuclei already formed serving as bases even when a negative bias voltage or a negative bias voltage increased in absolute value is later applied to thereby change the conditions to those favorable for the formation of γ alumina.

Thus, it was found that the step of forming α crystal structure alumina in the early stage of film formation without applying any negative bias voltage or while controlling the negative bias voltage, when applied, so that any other crystal phases than the α crystal structure phase may not be formed, and the subsequent step comprising forming highly hard a alumina while applying a negative bias voltage or a negative bias voltage higher in absolute value should be included.

Experiments made by the present inventors revealed that, in forming alumina films, the negative bias voltage to be applied in forming α alumina in the early stage of film formation should preferably be not higher than 100 V in absolute value (inclusive of the case of no bias voltage application) and that the application of a negative bias voltage of not lower than 200 V in absolute value in the middle of film formation and thereafter is adequate for attaining high hardness levels.

Since, however, the appropriate ranges of the bias voltage may vary depending on the constitution of the apparatus employed and other various conditions, the above numerical value ranges have no limitative meaning and, as mentioned hereinabove, α crystal structure alumina is to be formed in the early stage of film formation without applying any negative bias voltage or by controlling the negative bias voltage, if applied, so that any other crystal phases than the α crystal structure phase may not be formed; thereafter, highly hard α alumina can be formed while applying a negative bias voltage or a negative bias voltage higher in absolute value.

In the above method (III), the discharge condition during film formation is not particularly restricted. Thus, for simultaneously attaining an increased film formation rate and a decrease in film formation temperature, the method (III) may be combined with the above-mentioned methods (I) and (II).

For example, highly hard α type-based alumina can be formed efficiently by employing the above method (I-1) to promote the growth of α alumina crystals in the poisoning mode without applying any bias voltage and then changing the discharge condition from the poisoning mode to the transition mode to secure the growth of α alumina crystals in the transition mode and thereafter applying a negative bias voltage while maintaining the same discharge condition (namely the transition mode).

The method provided by the present invention can be applied also to the cases where the discharge condition is controlled by every means, for example controlling the discharge condition by varying the discharge voltage, or controlling the discharge condition by controlling some other factor such as the oxygen flow rate, oxygen partial pressure, discharge power or discharge current, for instance. As the sputtering method applicable in carrying out the method of the invention, there may be mentioned not only the pulsed DC sputtering method but also the high-frequency sputtering method, magnetron sputtering method, and ion beam sputtering method, among others.

(2) Re: Second Mode of Practice

The present inventors made investigations from various angles to produce α crystal structure-based alumina films efficiently and without fail at relatively low temperatures in forming crystalline alumina films on substrates by introducing oxygen.

As a result, it was found that when films are formed on substrates disposed so as to face the direction of sputtering of an aluminum metal target by continuous sputtering, α crystal structure-based alumina films are hardly obtained but that when the film formation is carried out intermittently in a plurality of substeps, α crystal structure-based alumina films can be easily obtained. Thus, a specific technique has been established for the above-mentioned intermittent film formation.

The present inventors further found that the thickness of the film formed in each substep in carrying out the intermittent film formation exerts an important influence on the formation of α crystal structure-based alumina films. In the following, the respective conditions specified for the formation of α crystal structure-based alumina films in accordance with the second mode of practice are described in detail.

The present inventors made such experiments as mentioned below by establishing the transition mode discharge condition in which alumina films can be formed at a relatively high rate in an oxidizing atmosphere containing oxygen gas together with Ar.

Figure 3:
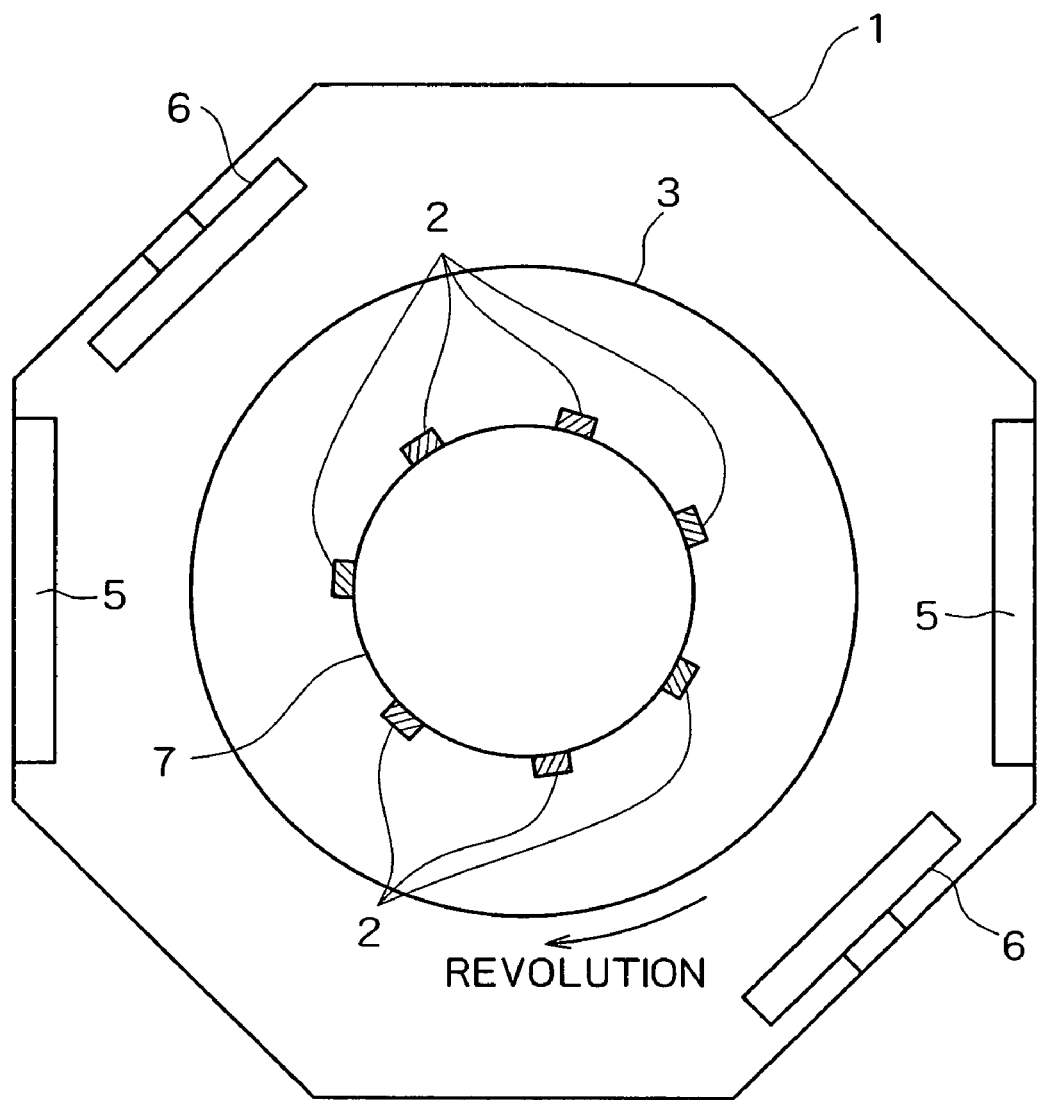
FIG. 3 is a schematic illustration (top view) of an apparatus constituted for the practice of the invention.
Figure 4:
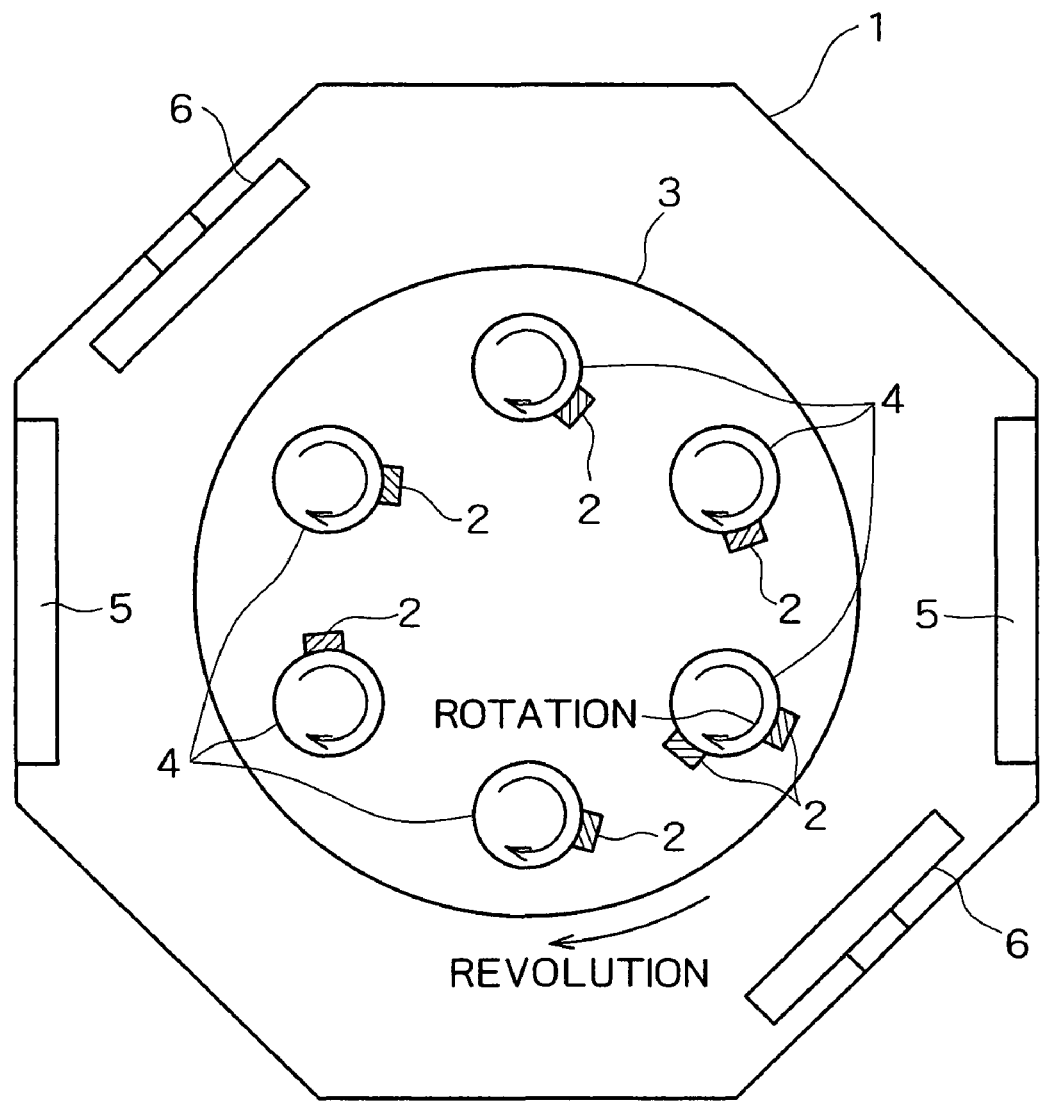
FIG. 4 is a schematic illustration (top view) of another apparatus constituted for the practice of the invention.
Figure 5:
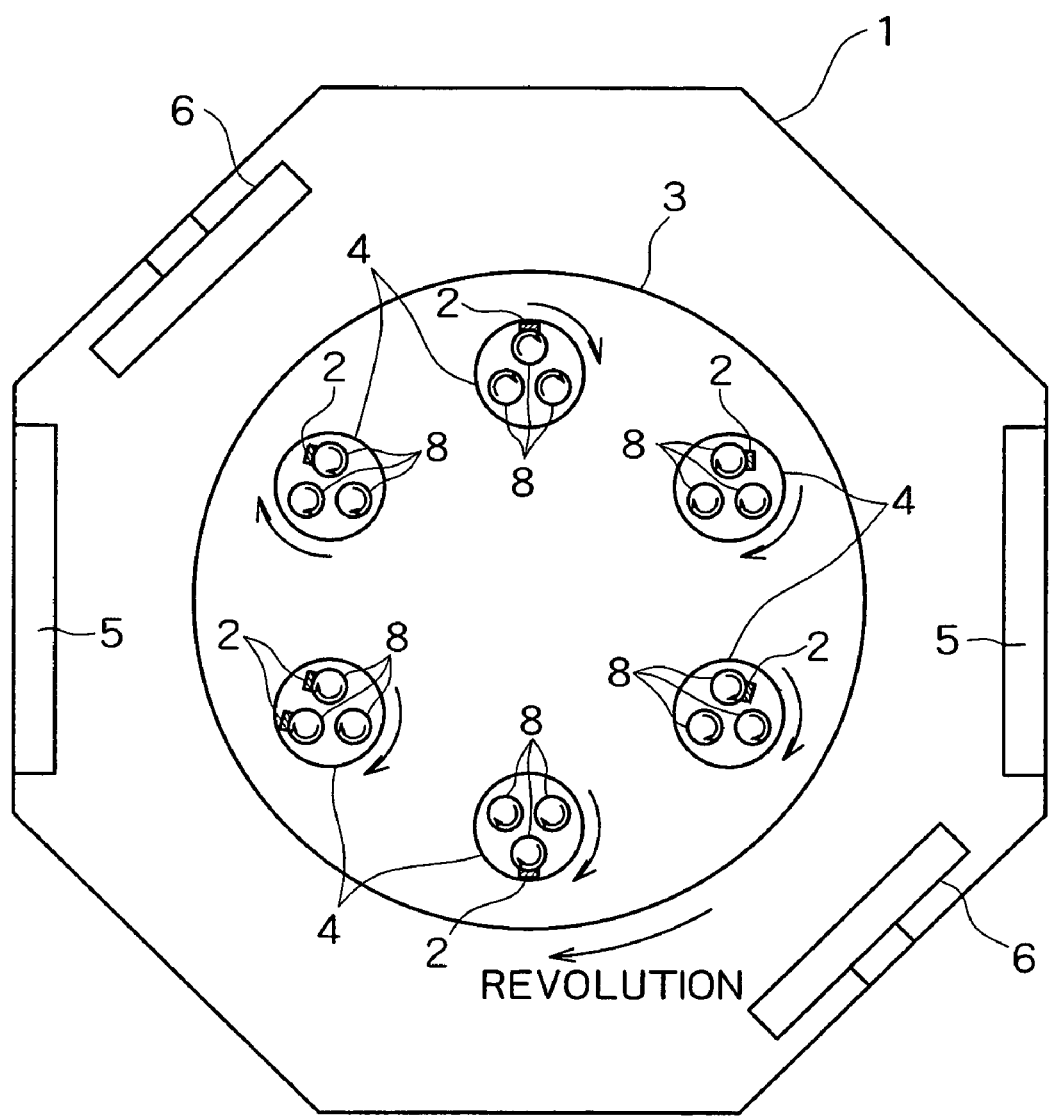
FIG. 5 is a schematic illustration (top view) of a further apparatus constituted for the practice of the invention.

First, a substrate was disposed so as to face the direction of sputtering of an aluminum metal target and film formation was carried out by continuous sputtering in the direction of the substrate. As a result, the crystal structure of the alumina films obtained mostly comprised the γ type alone but the α crystal structure could not be confirmed. Then, a turntable 3 or the like was disposed so as to face the direction of sputtering of each aluminum metal target, as shown in FIGS. 3 to 5, which are to be described later herein, substrates were fixed to the turntable 3 or the like, and film formation was carried out intermittently while rotating the turntable 3 or the like. In that case, the formation of α crystal structure alumina could be confirmed.

Although the mechanisms by which α crystal structure alumina is formed upon intermittent film formation in that manner are not clear, the following mechanisms are presumable from the results of the above-mentioned experiments and/or the fact that alumina is hardly formed in the transition mode discharge condition as compared with the poisoning mode under the same substrate temperature condition.

When the discharge condition is in the poisoning mode, oxygen exists in excess relative to the amount of aluminum atoms evaporated from the sputtering evaporation source (target) whereas it is thought that, in the transition mode, oxygen exists in a minimum amount necessary for the formation of alumina with aluminum atoms, so that metallic aluminum-free alumina films can be formed even in the transition mode discharge condition, as described hereinabove.

However, as indicated by the results of the above-mentioned experiments, it has been confirmed that when film formation is carried out continuously in the transition mode discharge condition while the sputtering cathode and substrate are standing still facing to each other, the alumina films obtained have the γ crystal structure alone whereas when film formation is carried out intermittently by alternately repeating a plurality of times the substep of film formation in the transition mode discharge condition and the substep involving no film formation, α crystal structure alumina is formed. As regards the reasons why such phenomena are observed, it is presumable that a film formation environment close to the poisoning mode is secured in the case of intermittent film formation.

Thus, in the case of intermittent film formation, the environment, while the sputtering cathode and substrate are facing each other and an alumina film is formed on the substrate, is in the same condition as in continuous film formation during which the sputtering cathode and substrate stand still facing each other and an alumina film is formed on the substrate. During the period of no film formation, however, the film just formed is supposedly exposed to oxygen gas fed to the inside of the apparatus and oxygen is fed thereto. Thus, presumably, the exposure to an oxygen excess atmosphere similar to that in the poisoning mode discharge condition exerts an effective influence on the formation of α crystal structure alumina.

In the process of completion of the present invention, it was also found that at least one period involving no film formation is necessary, as mentioned above, and that when the period involving no film formation is prolonged as compared with the film formation period, α crystal structure alumina is formed more readily and it is recommendable that at least almost the same film formation-free period as the film formation period be secured.

Furthermore, the present inventors investigated the quantitative influence of the thickness of the film formed in each film formation substep on the crystal structure of the alumina film obtained, and found that, for forming α crystal structure-based alumina films, it is necessary for the film thickness obtained in each substep to be not greater than 5 nm. When the film thickness per substep exceeds 5 nm, the proportion of the γ crystal structure increases and alumina films mainly having the α crystal structure can no longer obtained. A presumable reason therefore is that when the film thickness per substep is excessive, oxygen supply to the films becomes insufficient during the substep involving no film formation.

The present inventors further found that even when the average film formation rate is identical, alumina films higher in α crystal structure percentage can be formed by reducing the film thickness per substep. It was confirmed that when the film thickness per substep is suppressed to 2 nm or less, the α crystal structure can occupy almost the whole area of the resulting alumina film while the γ crystal structure exists only in slight amounts, and that when the film thickness per substep is reduced preferably to 1 nm or less, alumina films substantially having the α crystal structure alone can be formed.

In this manner, it becomes easier for alumina films substantially having the α crystal structure alone to be formed with the decrease in film thickness per substep. When the film thickness per substep is excessively small, a prolonged period of time is required for the formation of alumina films having a desired thickness. Thus, from the productivity viewpoint, the lower limit to the film thickness per substep is about 0.3 nm.

Then, the present inventors made experiments in which the thickness of the film formed in each substep was varied between the early stage and the middle and later stages of film formation. As a result, it was revealed that when film formation is carried out while suppressing the film thickness per substep in the early stage of film formation to 2 nm or less, alumina films higher in α crystal structure content can be formed even if the film thickness per substep in the middle and later stages of film formation is increased within the range not exceeding 5 nm. The method comprising increasing the film thickness per substep in the middle and later stages of film formation is desirable since the load on the apparatus, in particular the rotating mechanisms, which is to be described later herein, can be reduced. Further, in the case of production in such a manner, the film formation rate in the middle and later stages of film formation can be increased, and this is favorable from the viewpoint of increased film formation efficiency.

The above mechanisms are presumably as follows. As the film thickness per substep is reduced in the early stage of film formation, the percentage of the α crystal structure increases. Once an undercoat layer high in that percentage has been formed, the growth of α crystal structure alumina utilizing, as bases, the already formed crystal nuclei rich in a structure becomes easy even when the thickness of the film formed thereon per substep is increased and intermittent film formation is continued.

As specific techniques for intermittently forming alumina films in the manner mentioned above, there may be mentioned the following methods. First, as shown in FIGS. 3-5, there may be mentioned the method comprising fixing substrates to a turntable or the like disposed so as to face the direction of sputtering of each aluminum metal target and forming alumina films intermittently while rotating the substrates by rotating the turntable or the like.

(a) FIG. 3 illustrates an apparatus comprising a turntable 3 disposed so as to face the direction of sputtering of each aluminum metal target 6. Substrates 2 are fixed to the turntable 3 (in FIG. 3, the substrates 2 being fixed to a substrate supporting member 7 in turn fixed to the turntable 3), and sputtering is performed while the turntable 3 is rotated for intermittent formation of an alumina film on each substrate 2. When the substrates 2 are rotated before the aluminum metal target 6 to allow film formation to proceed only during the period of the substrate 2 facing the target, periods involving no film formation can be provided and intermittent film formation can be realized.

(b) FIG. 4 illustrates an apparatus comprising a turntable 3 disposed so as to face the direction of sputtering of each aluminum metal target 6, and satellite rotary members 4 disposed on the turntable 3. Substrates 2 are fixed to the satellite rotary members 4, and the method of intermittently forming alumina films on the substrates 2 is realized while the turntable 3 and satellite rotary members 4 are rotated. As shown in FIG. 4, when the turntable 3 is rotated and, simultaneously, the satellite rotary members 4 are rotated, each satellite rotary member 4 shows a revolution movement and at the same time a rotation movement, so that the film formation time per substep can be shortened as compared with the example shown in FIG. 3, hence the film thickness per substep can be reduced.

(c) FIG. 5 shows an apparatus comprising a turntable 3 disposed so as to face the direction of sputtering of each aluminum metal target, satellite rotary members 4 disposed on the turntable 3, and rotary members 8 disposed on each satellite rotary member 4. Substrates 2 are fixed to the rotary members 8, and the method of intermittent formation of an alumina film on each substrate 2 is realized by rotating the turntable 3, satellite rotary members 4 and rotary members 8.

According to this method, the rotation of each rotary member 8 disposed on each satellite rotary member 4 adds to the rotation and revolution resulting from the combination of the turntable 3 and each satellite rotary member 4, as shown in FIG. 4, so that the film formation time per substep can be further shortened as compared with the example shown in FIG. 4, hence the film thickness per substep can be extremely reduced.

In accordance with the present invention, it is an indispensable condition for the film thickness per substep to be not greater than 5 nm, as mentioned above. When intermittent film formation is carried out by the methods shown in FIGS. 3-5, the film thickness per substep can be controlled with ease by adjusting the revolution speed of the above-mentioned turntable 3, satellite rotary members 4, or rotary members 8. The rotary table 3 is preferably rotated at 3 rpm or a greater revolution speed, more preferably at 6 rpm or a greater revolution speed. The satellite rotary members 4 are preferably rotated at 20 rpm or a greater revolution speed, since, on that occasion, the film thickness per substep can be reduced and the formation of α crystal structure alumina becomes easier. A more preferred revolution speed of the satellite rotary members 4 is 40 rpm or greater.

The apparatus shown in FIGS. 3-5 are provided, on the wall surface, with two heaters 5 for heating substrates and so forth. The wall surface may be provided with one or more additional heaters and, further, as shown in relation to the apparatus used in the examples to be mentioned later herein, a center heater may further be disposed approximately in the center of the turntable. The radiant heat from the center heater is thought to activate the atoms in each alumina film just after formation thereof, so that the reaction with oxygen, among others, in the atmosphere may presumably be promoted in each period during which no film formation is carried out, hence crystallization may presumably be promoted in a favorable manner.

In FIGS. 3-5, sputtering cathodes are disposed at two sites. Where necessary, film formation may be carried out using one sputtering cathode alone, or one or more further sputtering cathodes may be disposed so that sputtering may be realized at three or more sites.

Figure 6:
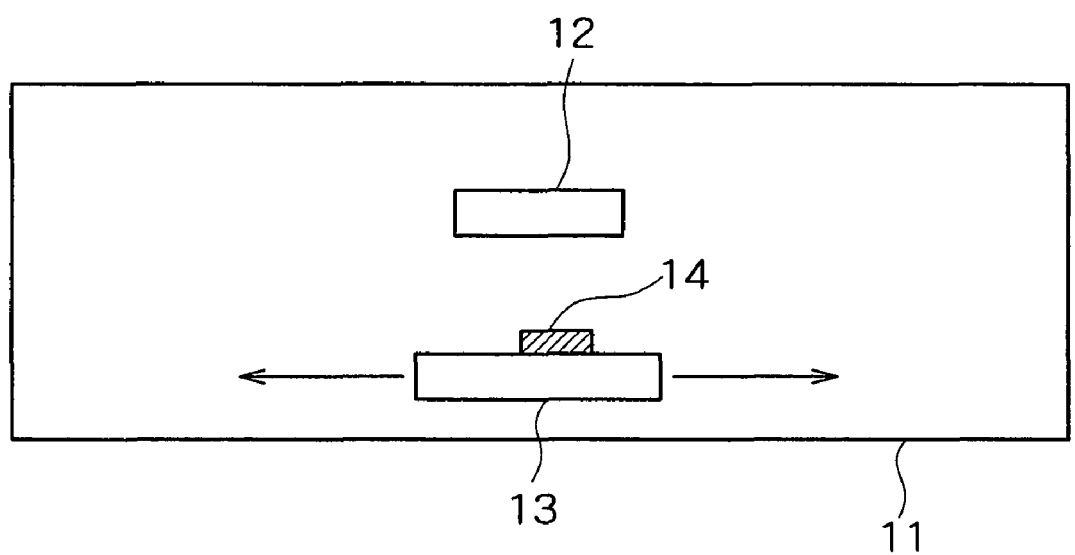
FIG. 6 is a schematic illustration (top view) of a further apparatus constituted for the practice of the invention.

(d) As another method of intermittently forming alumina films, there may be mentioned the method comprising fixing a substrate 14 to a mobile table 13 disposed so as to face the direction of sputtering of an aluminum metal target 12 within an apparatus (vacuum chamber) 11, as shown in FIG. 6, and intermittently forming an alumina film on the substrate while the mobile table 13 is moved reciprocally so as to cross the direction of sputtering. According to this method, film formation on the substrate is carried out when the mobile table is located within the range of sputtering, which is approximately in the central portion, but when the table has moved to and is in each end portion outside the range of sputtering, no film formation is carried out but the exposure effect produced by oxygen gas is to be enjoyed owing to such a mechanism. The film formation period and film formation-free period can be alternately repeated by repeated translation of the substrate almost perpendicularly to the direction of sputtering. The film thickness per substep can be arbitrarily controlled by varying the speed of reciprocating movement of the mobile table 13.

(e) Mention may further be made of the method comprising disposing a shutter between an aluminum metal target and a substrate disposed so as to face the direction of sputtering and carrying out intermittent alumina film formation on the substrate while opening and closing the shutter perpendicularly to the direction of sputtering. According to this method, the film thickness per substep can be arbitrarily controlled by controlling the timing of shutter opening/closing or the opening/closing cycle.

(f) As a further useful method, there may be mentioned the method comprising carrying out intermittent alumina film formation on a substrate disposed so as to face the direction of sputtering of an aluminum metal target while intermittently carrying out sputtering. In this case, the film thickness per substep can be caused to be fall within the range specified herein by controlling the discharge time per substep, for instance.

The other film formation conditions to be employed in the practice of the invention are not particularly restricted. To employ the transition mode as the discharge condition during sputtering is very effective in increasing the film formation rate and forming alumina films free of metallic aluminum, as mentioned above. The transition mode discharge condition can be attained not only by controlling the discharge condition by varying the discharge voltage but also by controlling another factor or factors, such as the oxygen flow rate and/or oxygen partial pressure, discharge power, discharge current, etc.

The present invention not only aims at forming alumina films free of metallic aluminum but also is based on the assumption that film formation should be carried out in an oxidizing gas-containing atmosphere so that the oxygen exposure effect may be obtained during each film formation-free period, as mentioned above. However, such details as the gas composition are not to be restricted. The oxygen partial pressure may be increased by feeding oxygen gas into the Ar atmosphere and, further, the method comprising feeding $O_3$ or $H_2O_2$ to the Ar atmosphere may be mentioned.

The method of sputtering which can be applied in the practice of the invention includes the pulsed DC sputtering method and, further, the high-frequency sputtering method, magnetron sputtering method, and ion beam sputtering method, among others.

The following examples illustrate the present invention more specifically. These examples are by no means limitative of the scope of the invention, however. Appropriate modifications may be made within the range within which the purposes described hereinabove and hereinafter can be realized, hence they all fall within the scope of the present invention.

Thus, while alumina film formation was carried out using a turntable and so forth in the examples given below relating to the second mode of practice, the present invention is not limited to such examples but of course includes the use of such a shutter mechanism as mentioned above or the use of the intermittent sputtering technique.

EXAMPLES

Examples Relating to the Methods (I) and (II) in the First Mode of Practice

In the examples, substrates made of a cemented carbide and having a size of 12.7 mm×12.7 mm×5 mm were used after mirror polishing (to about Ra=0.02 μm), ultrasonic cleaning in an alkali solution vessel and a pure water vessel, followed by drying, and preliminary CrN film formation by the arc ion plating method.

Figure 7:
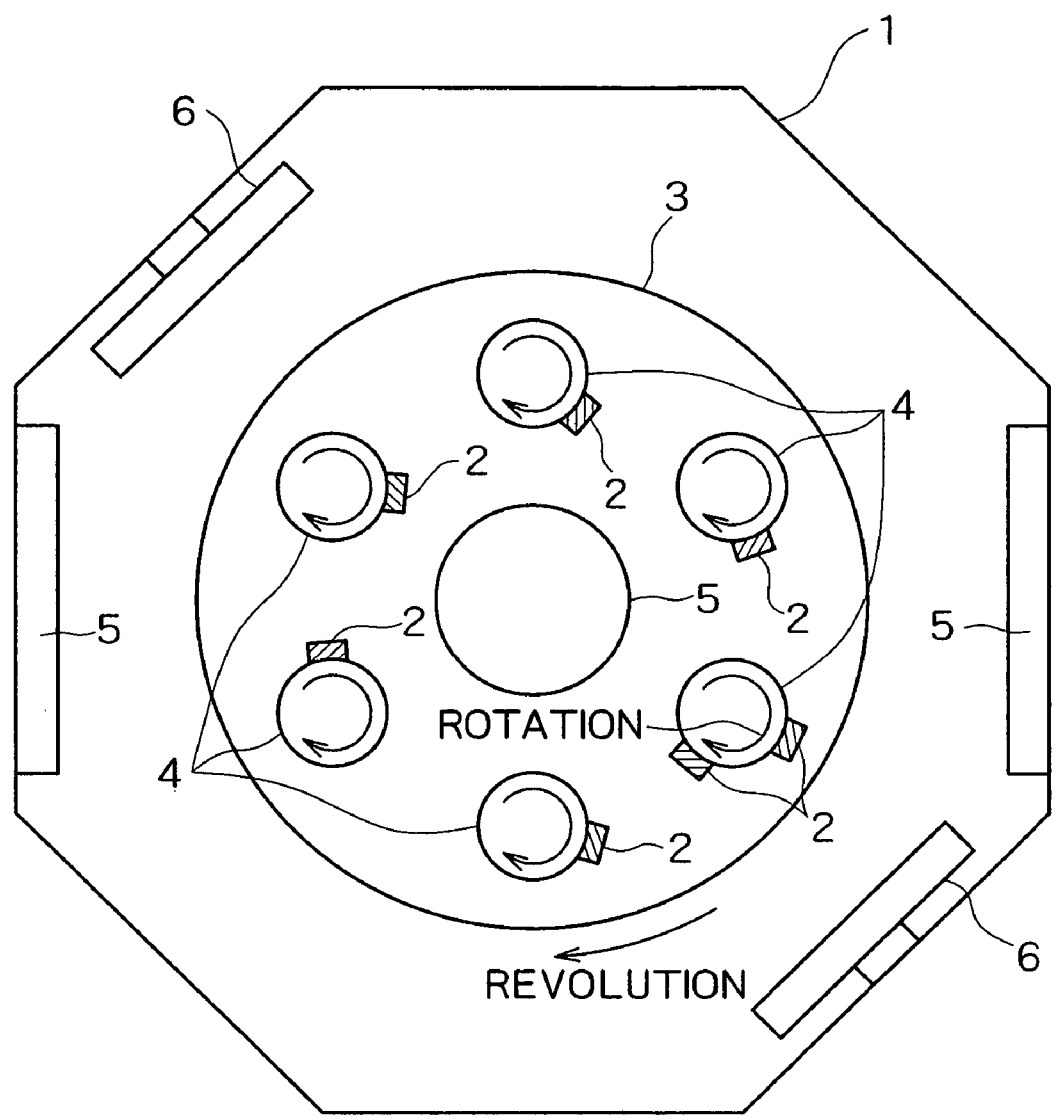
FIG. 7 is a schematic illustration (top view) of a further apparatus constituted for the practice of the invention.

In these examples, as shown in FIG. 7, the CrN film oxidation and the α type-based alumina film formation were carried out in the following manner using a vacuum film forming apparatus equipped with magnetron sputtering cathodes, heaters, substrate rotating mechanisms and so forth [model AIP-S40 multiple function machine, product of Kobe Steel, Ltd.].

Thus, samples (CrN film-covered cemented carbide substrates) 2 were set on satellite rotary members (substrate holders) 4 on a turntable 3 in the apparatus 1, and the apparatus inside was evacuated almost to a vacuum condition and, then, the samples were heated to the substrate temperature for the early stage of film formation as specified in Table 1 by means of heaters 5. After attainment of the specified sample temperature, oxygen gas was introduced into the apparatus 1 and the CrN film on the sample surface was oxidized, and the resulting samples were used as substrates for α type-based alumina film formation.

Then, an α crystal structure-based alumina film was formed on the above-mentioned oxidized layer. After one or two aluminum metal targets were mounted on one or two sputtering cathodes 6 shown in FIG. 7, the alumina film formation was carried out in an argon-oxygen atmosphere by the pulsed DC sputtering method. In Example 2 of the invention to be mentioned later herein, discharge was carried out using one sputtering cathode 6 and, in other examples, two sputtering cathodes 6 were used. The discharge power was about 2 to 3.2 kW per sputtering cathode 6. Only in the early stage of film formation in Example 3 of the invention to be mentioned later herein, the discharge power was about 300 W per sputtering cathode 6.

During film formation, the Ar gas flow rate was maintained at a constant level of 120 sccm, the oxygen gas flow rate and discharge voltage were adequately adjusted to attain the specified discharge condition. Thus, during film formation, the gas evaporated was analyzed by a plasma emission spectrometer analyzer located at about 20 mm distant from the sputtering surface of the target, and the discharge voltage was adjusted using the emission intensities of aluminum and oxygen as measures to attain the specified discharge condition. The film formation was carried out while rotating the turntable 3 and satellite rotary members (substrate holders) 4, as shown in FIG. 7. The discharge condition, the substrate temperature, the film formation times in the early stage and middle and later stages of film formation during film formation were as shown in Table 1.

The thicknesses of the thus-formed alumina films were determined by measuring the differences in level on a silicon substrate. The alumina film surface was subjected to grazing incidence X ray diffraction analysis (grazing incidence XRD analysis) to identify the crystal structure. The extent of the formation of α crystal structure alumina was estimated from the results of X ray diffraction analysis by examining the presence or absence of the peak indicating α crystal structure alumina and the peak indicating γ crystal structure alumina. The results thus obtained are shown in Table 1, together with the film formation conditions.

TABLE 1

|  | Early film formation stage | | | Middle and later film formation stages | | | Total film formation period | Film formation rate *2 (nm/min) | Alumina film thickness (μm) | Crystal structure |
| --- | --- | --- | --- | --- | --- | --- | --- | --- | --- | --- |
|  | Discharge condition | Substrate temperature (° C.) | Film formation period | Discharge condition | Substrate temperature (° C.) | Film formation period |  |  |  |  |
| Comparative Example 1 | Poisoning mode | 750-780 | 6 hrs | — | — | — | 6 hrs | 0.53 | 0.19 | α |
| Comparative Example 2 | Transition mode | 750-780 | 2 hrs 15 min | — | — | — | 2 hrs 15 min | 5.0 | 0.68 | α + γ |

TABLE 1-continued

|  | Early film formation stage | | | Middle and later film formation stages | | | Total film formation period | Film formation rate *2 (nm/min) | Alumina film thickness (μm) | Crystal structure |
| --- | --- | --- | --- | --- | --- | --- | --- | --- | --- | --- |
|  | Discharge condition | Substrate temperature (° C.) | Film formation period | Discharge condition | Substrate temperature (° C.) | Film formation period |  |  |  |  |
| Comparative Example 3 | Transition mode | 650-680 | 2 hrs | — | — | — | 2 hrs | 14.6 | 1.75 | γ |
| Example 1 of Invention | Poisoning mode | 750-780 | 10 min | Transition mode | 750-780 | 2 hrs 50 min *1 | 3 hrs | 3.5 | 0.63 | α |
| Example 2 of Invention | Poisoning mode | 650-680 | 10 min | Transition mode | 650-680 | 2 hrs 50 min *1 | 3 hrs | 5.4 | 0.97 | α + γ |
| Example 3 of Invention | Transition mode | 750-780 | 10 min | Transition mode | 750-780 | 2 hrs 50 min | 3 hrs | 4.8 | 0.86 | α |
| Example 4 of Invention | Transition mode | 880-900 | 10 min | Transition mode | 650-680 | 2 hrs 50 min | 3 hrs | 10.0 | 1.8 | α |

*1: The film formation period in the middle and later stages of film formation includes the time for changing the poisoning mode to the transition mode.
*2: (Alumina film thickness)/(total film formation period)

The following discussion is possible based on Table 1. Thus, in Comparative Example 1, films were formed in the poisoning mode discharge condition alone. It can be seen that, in that case, α type-based alumina films can be formed but the film formation rate is very slow, hence impractical.

In Comparative Example 2 and Comparative Example 3, films were formed in the constant discharge condition, namely in the transition mode, and the substrate temperature in Comparative Example 2 was the same as that in Comparative Example 1, namely 750-780° C., and that in Comparative Example 3 was relatively low, namely 650-680° C. In each of Comparative Example 2 and Comparative Example 3, films were formed in the transition mode, so that the film formation could be realized at a rate about 10 times that in Comparative Example 1. However, the alumina films obtained in Comparative Example 2 showed an α/γ mixed crystal structure (when the peak intensity I α at 2θ=25.5761° was selected as the X ray diffraction peak representative of γ crystal structure alumina and the peak intensity I γ at 2θ=19.4502° as the X ray diffraction peak representative of α crystal structure alumina, the I α/I γ value was 6.8) and, in Comparative Example 3 in which films were formed at a lower substrate temperature as compared with Comparative Example 2, γ crystal structure alumina alone was formed.

These results indicate that the film formation in the transition mode discharge condition can increase the film formation rate as compared with the film formation in the poisoning mode but, as for the crystal structure of the alumina films obtained, the formation of α crystal structure alumina is difficult as compared with the poisoning mode and this tendency becomes more remarkable as the substrate temperature during film formation decreases.

On the contrary, it can be confirmed that when the film formation is carried out by the methods of the invention as mentioned below, α crystal structure alumina can be formed with good efficiency.

Thus, in Example 1 of the invention, the film formation was carried out in the poisoning mode in the early stage of film formation alone and the discharge condition was then changed to the transition mode for continued film formation. The rate of film formation in Example 1 of the invention was significantly higher as compared with Comparative Example 1 mentioned above, namely almost the same as in Comparative Example 2 or 3 mentioned above. Unlike Comparative Examples 2 and 3, however, alumina films having the α crystal structure alone were obtained.

In Example 2 of the invention, the film formation was carried out in a lower temperature range throughout the whole film formation period as compared with Example 1 of the invention. Whereas, in Comparative Example 3 in which films were formed in the same temperature range as in Example 2 of the invention, no α crystal structure alumina could be formed at all but the γ type alone was formed, it is evident that, in Example 2 of the invention, α type-based alumina was formed although the γ type was formed in a certain proportion (the peak at 2θ=19.4502° was not detected but other peaks indicative of the γ crystal structure were found). These results obtained in Example 1 of the invention and Example 2 of the invention indicate that when α alumina crystal nuclei are formed as an undercoat in the poisoning mode in the early stage of film formation, the α type is formed with ease even if the subsequent film formation is carried out in the transition mode.

In Example 3 of the invention, films were formed for 10 minutes at a film formation rate of about 0.5 nm/min and at a discharge power decreased by adjusting the oxygen flow rate and discharge voltage in the early stage of film formation alone, and the subsequent film formation was carried out at a film formation rate of about 5 nm/mm while the discharge power was increased; the discharge condition throughout the whole film formation period was the transition mode. Whereas, in Comparative Example 2 in which the discharge condition was the transition mode and the film formation rate was 5.0 nm/min, alumina films contaminated with the γ type were formed, it is evident from the results of Example 3 of the invention that α crystal structure alumina is formed as an undercoat by film formation at a decrease rate of film formation in the early stage of film formation alone even when the film formation is carried out in the transition mode, and that even when the film formation rate is increased thereafter, α type-based alumina films can be formed.

In Example 4 of the invention, films were formed at an early film formation stage substrate temperature somewhat higher than that in Example 3 of the invention and the substrate temperature in the middle and later stages of film formation was in a lower temperature range than in Example 3 of the invention. In this case, too, α alumina crystal nuclei were formed in the early stage of film formation at elevated temperatures, and □ alumina was formed selectively and α type-based alumina films were formed in spite of the fact that the subsequent film formation was carried out at a lowered substrate temperature.

Examples Relating to the Method (III) in the First Mode of Practice

In the examples, substrates made of a cemented carbide and having a size of 12.7 mm×12.7 mm×5 mm were used after mirror polishing (to about Ra=0.02 μm), ultrasonic cleaning in an alkali solution vessel and a pure water vessel, followed by drying, and preliminary CrN film formation by the arc ion plating method.

In these examples, as shown in FIG. 7, the CrN film oxidation and the α type-based alumina film formation were carried out in the following manner using a vacuum film forming apparatus equipped with magnetron sputtering cathodes, heaters, substrate rotating mechanisms and so forth [model AIP-S40 multiple function machine, product of Kobe Steel, Ltd.].

Thus, samples (CrN film-covered cemented carbide substrates) 2 were set on satellite rotary members (substrate holders) 4 on a turntable 3 in the apparatus 1, and the apparatus inside was evacuated almost to a vacuum condition and, then, the samples were heated to the substrate temperature of 750° C. by the heaters 5. After attainment of the specified sample temperature, oxygen gas was introduced into the apparatus 1 and the CrN film on the sample surface was oxidized, and the resulting samples were used as substrates for α type-based alumina film formation.

Then, an α crystal structure-based alumina film was formed on the above-mentioned oxidized layer. After an aluminum metal target was mounted on each sputtering cathode 6 shown in FIG. 7, the alumina film formation was carried out in an argon-oxygen atmosphere by the pulsed DC sputtering method using two sputtering cathodes 6. The discharge power was about 2 to 3.2 kW per sputtering cathode 6. During film formation, the Ar gas flow rate was maintained at a constant level of 120 sccm, the oxygen gas flow rate and discharge voltage were adequately adjusted to attain the specified discharge condition. Thus, during film formation, the gas evaporated was analyzed by a plasma emission spectrometer analyzer located at about 20 mm distant from the sputtering surface of the target, and the discharge voltage was adjusted using the emission intensities of aluminum and oxygen as measures to attain the specified discharge condition. The film formation was carried out while rotating the turntable 3 and satellite rotary members (substrate holders) 4, as shown in FIG. 7.

In Comparative Example 11 to be compared with the above example, films were formed in the same manner as in Example 1 of the invention in the above-mentioned Example 1. Thus, in the early stage of film formation, the film formation was carried out in the poisoning mode discharge condition for 10 minutes while the substrate temperature was maintained at 750° C. Thereafter, the substrate temperature was maintained at the above-mentioned level, the discharge condition alone was changed to the transition mode, and the film formation was continued for 2 hours and 50 minutes. In the whole film formation step in this Comparative Example 11, the film formation was carried out without applying any bias voltage to the substrates.

Since the film formation was carried out under those conditions enabling higher rate film formation which had been selected from among the conditions for attaining the transition mode based on the experimental results obtained in the examples mentioned above, about 2-μm-thick alumina films could be formed in a total film formation period of 3 hours in the examples relating to this method (III).

The crystal structure of the films obtained was examined in the same manner as Examples 1 mentioned above by grazing incidence X ray diffraction and was confirmed to be of the α alumina single phase. The film hardness confirmed by the nanoindentation method was 22 GPa.

The method of hardness measurement by the nanoindentation technique is as follows. After polishing the film surface, five loads differing in level from 30 to 200 mN were applied to the surface using an Elionix model "ENT-1100a" apparatus with a Berkovich indenter, and the load-indentation depth characteristics were measured. The film hardness was determined by making calculations for calibration with respect to the frame compliance and indentation depth using the method proposed by Sawa et al. in J. Mater. Res., 16, 2001, pp. 3084-3096.

In Comparative Example 12, films were formed while a negative bias voltage of 300 V in absolute value was applied throughout the whole film formation step in Comparative Example 11 mentioned above. The hardness of the films obtained was checked by the above-mentioned nanoindentation method and found to be 27 GPa, namely a higher hardness as compared with Comparative Example 11 in which no bias voltage was applied. However, upon grazing incidence X ray diffraction of the crystal structure of the films, it was confirmed that the films were contaminated with γ alumina although they were mainly of the α type.

In Example 11 of the invention, films were formed in the following manner. In the early stage of film formation, films were formed at a substrate temperature of 750° C. for 10 minutes while the discharge condition was maintained in the poisoning mode and, then, the discharge condition was changed to the transition mode and film formation was continued for 30 minutes. The above step was carried out without applying any bias voltage. Thereafter, film formation was carried out for 2 hours and 20 minutes while a negative bias voltage of 300 V in absolute value was applied and the above-mentioned conditions were maintained. The total film formation time was 3 hours. The thickness of the alumina films obtained was about 1.8 μm.

The crystal structure of the films obtained in Example 11 of the invention was checked by the grazing incidence X ray diffraction and found to be of the α crystal structure alumina single phase. The hardness of the alumina films was measured by the above-mentioned nanoindentation method and found to be 26 GPa; thus, the films obtained were higher in hardness than those obtained in Comparative Example 11 in which no bias voltage was applied.

These results indicate that when no bias voltage is applied in the early stage of film formation and a bias voltage is applied in the middle stage and thereafter, α crystal structure alumina films high in hardness can be obtained.

Examples Relating to the Second Mode of Practice

In the examples, substrates made of a cemented carbide and having a size of 12.7 mm×12.7 mm×5 mm were used after mirror polishing (to about Ra=0.02 μm), ultrasonic cleaning in an alkali solution vessel and a pure water vessel, followed by drying, and preliminary CrN film formation by the arc ion plating method.

In these examples, as shown in FIG. 7, the CrN film oxidation and the α type-based alumina film formation were carried out in the following manner using a vacuum film forming apparatus equipped with magnetron sputtering cathodes, heaters, substrate rotating mechanisms and so forth [model AIP-S40 multiple function machine, product of Kobe Steel, Ltd.].

Thus, samples (CrN film-covered cemented carbide substrates) 2 were set on satellite rotary members (substrate holders) 4 disposed on a turntable 3 in the apparatus 1, and the apparatus inside was evacuated almost to a vacuum condition and, then, the samples were heated to 750-780° C. by means of heaters 5. After attainment of the specified sample temperature, oxygen gas was introduced into the apparatus 1 and the CrN film on the sample surface was oxidized, and the resulting samples were used as substrates for α type-based alumina film formation.

Then, an α crystal structure-based alumina film was formed on the above-mentioned oxidized layer. The apparatus shown in FIG. 7 as used for film formation was constituted such that the turntable 3 could be rotated and the satellite rotary members (substrate holders) 4 disposed thereon could also be rotated, so that the satellite rotary members (substrate holders) 4 could show a rotation movement while showing a revolution movement. In forming films while the turntable 3 alone was rotated, the substrates 2 were fixed to the satellite rotary members (substrate holders) 4 so as to face the sputtering cathode 6 and the rotation of the satellite rotary members (substrate holders) 4 was stopped.

The formation of the alumina films was carried out in an argon- and oxidizing gas-containing atmosphere by the pulsed DC sputtering method after mounting an aluminum metal target on the sputtering cathode 6 shown in FIG. 7. In the examples, either one of the two sputtering cathodes 6 shown in FIG. 7 was used for film formation. The film thickness and film formation time per substep in forming films intermittently were adjusted by controlling the numbers of revolution of the turntable 3 and/or of the satellite rotary members (substrate holders) 4 and/or the discharge power.

The discharge power given to the sputtering cathode 6 was about 3 kW, the Ar gas flow rate was maintained at a constant level of 120 sccm, and the oxygen gas flow rate and discharge voltage were adequately adjusted so that the discharge condition might be in the transition mode. Thus, during film formation, the composition of the gas evaporated was analyzed by a plasma emission spectrometer analyzer located at about 20 mm distant from the target surface from which aluminum atoms to be evaporated, the emission intensities of aluminum and oxygen were measured as measures and, based on the measurement results, the discharge voltage was adjusted.

Heating was carried out using the center heater 5 and the heaters 5 disposed on the apparatus wall surface, and the substrate temperature during film formation was maintained within the range of about 750-780° C. The rotation or no rotation and the numbers of revolutions of the turntable 3 and satellite rotary members (substrate holders) 4, and the film formation time were as shown in Table 2. In cases where intermittent film formation was carried out as shown in Table 2 and the turntable 3 alone was rotated, the film thickness per substep was calculated from the thickness of the alumina film obtained, the film formation time and the revolution speed.

In cases where the turntable 3 and satellite rotary members (substrate holders) 4 are rotated simultaneously, each satellite rotary member (substrate holder) 4 is rotated about once during its passage through the film forming region before each target whereas the film formation on the substrate fixed to one site of a satellite rotary member (substrate holder) 4 is carried out, for example, once or dividedly twice [film formation just after entering the film formation region and repeated film formation just before leaving the film formation region after moving to a position not facing any target as a result of the rotation of the relevant satellite rotary member (substrate holder) 4] according to the timing of the passage of the satellite rotary member through the region (film formation region) before the target. In this manner, in cases where the turntable 3 and satellite rotary members (substrate holders) 4 are rotated simultaneously, the film thickness per substep becomes greatest when film formation is carried out in one stroke among the film formation carried out in one stroke, and the film formation in the first half or the latter half as divided into two. Therefore, the value of said maximum thickness is shown in Table 2 for each example.

As detailed described later herein, the film thickness per substep was increased in Example 6 of the invention by varying the revolution speed of the turntable 3 during film formation.

The thicknesses of the thus-formed alumina films were determined by measuring the differences in level on a silicon substrate. Further, the surface of each laminate film formed was analyzed by means of a grazing incidence X ray diffraction analyzer, and the crystal structure of the alumina film formed as the uppermost coat layer was identified. Thus, based on the X ray diffraction measurement results, the peak intensity I α at 2θ=25.5761(°) was selected as the X ray diffraction peak representative of α crystal structure alumina and the peak intensity I γ at 2θ=19.4502(°) as the X ray diffraction peak representative of α crystal structure alumina and, based on the ratio between these intensities, namely the I α/I γ value, the extent of α crystal structure alumina was evaluated. These results are also shown in Table 2.

TABLE 2

|  | Turntable rotation | | Satellite rotary member rotation | | Film formation per substep | Film formation period | Alumina film thickness | Crystal structure of alumina film | |
|---|---|---|---|---|---|---|---|---|---|
|  | Revolution speed (rpm) | | Revolution speed (rpm) | | (nm) | | (μm) | I α/I γ | |
| Comparative Example 1 | No (target and substrate standing still and facing each other) | | | | — | 2 hrs | 0.7 | No α peak was detected. *2 | γ |
| Comparative Example 2 | Yes | 1 | No | — | 7.5 | 3 hrs | 1.35 | 0.96 | α + γ |
| Example 1 of Invention | Yes | 3 | No | — | 3.1 | 3 hrs | 1.7 | 2.0 | α + γ |
| Example 2 of Invention | Yes | 6 | No | — | 1.5 | 3 hrs | 1.65 | 15.5 | α + γ |
| Example 3 of Invention | Yes | 10 | No | — | 0.96 | 3 hrs | 1.73 | No γ peak was detected. *2 | α |
| Example 4 of Invention | Yes | 3 | Yes | 20 | 1.9≧ | 3 hrs | 1 | 10.4 | α + γ |

TABLE 2-continued

| | Turntable rotation | | Satellite rotary member rotation | | Film formation per substep | Film formation | Alumina film thickness | Crystal structure of alumina film | |
|---|---|---|---|---|---|---|---|---|---|
| | | Revolution speed | | Revolution speed | | | | | |
| | | (rpm) | | (rpm) | (nm) | period | (μm) | I α/I γ | |
| Example 5 of Invention | Yes | 6 | Yes | 40 | 0.68≧ | 3 hrs | 0.74 | No γ peak was detected. *2 | α |
| Example 6 of Invention | Yes | 6 → 3 *1 | No | — | 1.5 → 3.3* | 3 hrs | 1.72 | 9.5 | α + γ |

*1: The revolution speed was changed after the lapse of 60 minutes from the start of film formation.
*2: The peak at 2θ = 25.5761° was not detected.
*3: The peak at 2θ = 19.4502° was not detected.

The following discussion is possible based on Table 2. In Comparative Example 1, films were formed continuously while the rotation of the turntable 3 and of the satellite rotary members (substrate holders) 4 was stopped and the sputtering cathode 6 and substrate 2 were allowed to stand still facing each other. In this case, the alumina films obtained consisted of the γ crystal structure alone.

In Comparative Example 2, films were formed while the turntable 3 shown in FIG. 7 alone was rotated. In this case, the film formation was carried out while rotating, unlike Comparative Example 1, and, therefore, it can be confirmed that α crystal structure alumina was formed in larger proportions in the alumina films obtained as compared with Comparative Example 1. However, the film thickness obtained in each substep exceeded the upper limit specified herein and, as a result, the proportion of the γ crystal structure was high.

In Examples 1 to 3 of the invention, the turntable 3 alone in the apparatus shown in FIG. 7 was rotated, and the revolution speed of the turntable was adjusted so that the thickness of the film formed per substep might fall within the range specified herein. The revolution speed was increased in Examples 1, 2 and 3 of the invention in that order and the film thickness per substep was thus reduced in carrying out the film formation.

These results indicate that α crystal structure alumina films can be formed more easily as the thickness of the film formed per substep decreases and that when the film thickness per substep is reduced to 5 nm or below as specified herein, α crystal structure-based alumina films can be formed. It is also evident that when the film thickness per substep is preferably reduced to 2 nm or below, the α crystal structure proportion can be still more increased and that when the film thickness per substep is more preferably reduced to 1 nm or below, alumina films mostly having the α crystal structure alone can be formed.

Examples 4 and 5 of the invention are examples in which both the turntable 3 and satellite rotary members (substrate holders) 4 shown in FIG. 7 were rotated and, in Example 5 of the invention, the numbers of revolutions of the turntable 3 and satellite rotary members (substrate holders) 4 were increased as compared with Example 4 of the invention. The results of these Examples 4 and 5 of the invention indicate that when the numbers of revolutions of the turntable 3 and satellite rotary members (substrate holders) 4 are increased to thereby decrease the thickness of the film formed per substep, the formation of α crystal structure alumina films becomes easier.

Comparison between Example 1 of the invention and Example 4 of the invention, in which the revolution speed of the turntable 3 was identical, and between Example 2 of the invention and Example 5 of the invention, in which the revolution speed of the turntable 3 was identical, reveals that when both the turntable 3 and satellite rotary members (substrate holders) 4 are rotated to cause revolution and rotation of substrates 2, the proportion of the α crystal structure significantly increases and it becomes easier to obtain α crystal structure-based alumina films.

The reason is presumably as follows. When the substrates are caused to undergo revolution and rotation, as in Examples 4 and 5 of the invention, each substrate 2 is still rotating even when it arrives at a position facing the sputtering cathode 6 as a result of revolution and, therefore, the film formation time per substep becomes shorter as compared with the case of mere revolution of the substrate 2. As a result, the thickness of the film formed per substep decreases and, further, the film is readily and sufficiently exposed to the oxidizing gas-containing atmosphere, so that the formation of the α crystal structure becomes easier.

Example 6 of the invention is an example in which the turntable 3 alone in the apparatus shown in FIG. 7 was rotated. After the lapse of 60 minutes from the start of film formation, the revolution speed of the turntable 3 was decreased from 6 rpm to 3 rpm to thereby increase the thickness of the film formed per substep. Comparison with Example 1 of the invention in which the revolution speed of the turntable 3 was maintained at 3 rpm throughout the whole film formation step reveals that the formation of α crystal structure alumina films can be promoted by increasing the revolution speed in question in the early stage of film formation alone.

Such mechanisms are presumably explained as follows. When film formation is carried out at an increased revolution speed, hence at a decreased amount of film formation per substep, in the early stage of film formation, an alumina undercoat layer substantially having the α crystal structure alone is formed and, thereafter, it becomes easy for α crystal structure alumina to subsequently grow utilizing the already formed α structure crystal nuclei as bases even when the thickness of the film formed per substep is then increased and the film formation is continued.

INDUSTRIAL APPLICABILITY

According to the invention, α crystal structure-based alumina films having good heat resistance can be formed efficiently without putting the substrates and apparatus, among others, under thermal load. As a result of realization of such a method of producing α crystal structure-based alumina films, cutting tools and the like improved in wear resistance and heat resistance as compared with the prior art can be provided in the manner of mass production. Further, α crystal structure-based alumina films higher in hardness can be formed and, thus, cutting tools and the like further improved in wear resistance and heat resistance can be provided.

In particular, when the method comprising intermittent film formation, as mentioned above, is employed, such alumina films as mentioned above can be formed efficiently in a relatively low temperature range not exceeding 800° C., in which the thermal load on the substrates, apparatus and so forth is small.

The invention claimed is:

1. A method of producing an α crystal structure-based alumina film, comprising:
    an initial first step of forming an undercoat of the alumina film having an α crystal structure under conditions suited for formation of α crystal structure alumina by sputtering of an aluminum metal target in an oxidizing gas-containing atmosphere; and
    a subsequent second step of continuing to form the film on the undercoat by changing the film forming conditions whereby an α crystal structure alumina continues to be formed on the undercoat.

2. A production method as set forth in claim 1, wherein the film forming conditions in said second step are changed to higher rate film forming conditions.

3. A production method as set forth in claim 1, wherein the film forming conditions in said second step are changed to lower temperature conditions.

4. A production method as set forth in claim 2, wherein the film formation in said first step is carried out in a poisoning mode discharge condition and the discharge condition in said second step is changed to a transition mode or a metal mode.

5. A production method as set forth in claim 2, wherein the film formation in the first step is carried out at a film formation rate not exceeding 1 nm/min and the second step is carried out at a film formation rate of not lower than 3 nm/min.

6. A production method as set forth in claim 1, wherein the film formation in the first step of film formation is carried out at a substrate temperature not lower than 800° C. and then a substrate temperature is lowered to 650-750° C. for the second step.

7. A production method as set forth in claim 1, wherein said second step is performed under conditions under which films with high hardness can be formed.

8. A production method as set forth in claim 1, wherein said second step is performed by increasing the absolute value of a negative bias voltage.

9. A production method as set forth in claim 1, wherein the first step is carried out while a negative bias voltage not higher than 100 V in absolute value is applied to the substrates and the second step is carried out while a negative bias voltage of 200 V or more is applied to the substrates.

* * * * *